US007263152B2

(12) United States Patent
Miller et al.

(10) Patent No.: US 7,263,152 B2
(45) Date of Patent: Aug. 28, 2007

(54) PHASE-LOCKED LOOP STRUCTURES WITH ENHANCED SIGNAL STABILITY

(75) Inventors: Rodney Dean Miller, Kernersville, NC (US); George F. Diniz, Liberty, NC (US); Ernest T. Stroud, Greensboro, NC (US)

(73) Assignee: Analog Devices, Inc., Norwood, MA (US)

( * ) Notice: Subject to any disclaimer, the term of this patent is extended or adjusted under 35 U.S.C. 154(b) by 720 days.

(21) Appl. No.: 10/717,394

(22) Filed: Nov. 18, 2003

(65) Prior Publication Data

US 2005/0105661 A1 May 19, 2005

(51) Int. Cl.
*H04L 25/00* (2006.01)

(52) U.S. Cl. .................... 375/371; 375/375; 375/376; 327/149; 327/156

(58) Field of Classification Search ............. 375/371, 375/373, 375, 376; 327/147, 149, 155, 156, 327/161; 370/503, 516
See application file for complete search history.

(56) References Cited

U.S. PATENT DOCUMENTS

| 5,075,640 | A | 12/1991 | Miyazawa ................. 331/10 |
| 5,180,994 | A | 1/1993 | Martin et al. |
| 5,576,666 | A | 11/1996 | Rauvola |
| 5,691,669 | A | 11/1997 | Tsai et al. |
| 5,942,949 | A | 8/1999 | Wilson et al. |
| 5,999,793 | A | 12/1999 | Ben-Efraim et al. |
| 6,091,931 | A | 7/2000 | Ben-Efraim et al. |
| 6,311,050 | B1 | 10/2001 | Welland et al. |
| 6,462,623 | B1 | 10/2002 | Horan et al. ................. 331/17 |
| 6,552,618 | B2* | 4/2003 | Nelson et al. ............... 331/11 |
| 6,747,519 | B2* | 6/2004 | Jaehne et al. ............... 331/16 |
| 6,952,124 | B2* | 10/2005 | Pham ........................ 327/156 |
| 7,046,093 | B1* | 5/2006 | McDonagh et al. .......... 331/16 |
| 7,133,485 | B1* | 11/2006 | Baird et al. ................ 375/376 |
| 2002/0089384 | A1 | 7/2002 | Ichihara ..................... 331/100 |

FOREIGN PATENT DOCUMENTS

| EP | 0224828 | A2 | 6/1987 |
| EP | 1193875 | A1 | 4/2002 |
| EP | 1294093 | A1 | 3/2003 |

* cited by examiner

*Primary Examiner*—Dac V. Ha
(74) *Attorney, Agent, or Firm*—Koppel, Patrick, Heybl & Dawson

(57) ABSTRACT

Phase-locked loop structures are provided that facilitate enhanced stability of loop-generated signals. They include an oscillator network, a feedback loop and a controller. The oscillator network generates a loop output signal with a frequency that varies in response to a control voltage and to a frequency-determining parameter, the feedback loop generates the control voltage in response to the loop output signal and a reference signal and the controller increments the frequency-determining parameter to maintain the control voltage within a predetermined control-voltage range. These structures enhance signal stability by facilitating the use of low-gain oscillator structures and they simplify and shorten loop operations because the structures operate in a closed-loop condition at all times.

36 Claims, 5 Drawing Sheets

PHASE-LOCKED LOOP STRUCTURES WITH ENHANCED SIGNAL STABILITY

BACKGROUND OF THE INVENTION

1. Field of the Invention

The present invention relates generally to phase-locked loop structures.

2. Description of the Related Art

Phase-locked loop structures are used in a wide variety of modern electronic systems (e.g., signal-conditioning systems, signal-generating systems and communication systems) that require stable signals whose frequencies can be easily selected (i.e., synthesized) and whose close-in spectrum approximates that of a stable reference oscillator (e.g., a crystal oscillator).

The phase-locked loop of these structures is generally completed around a voltage-controlled oscillator that generates an oscillator signal whose oscillator frequency varies in response to a control voltage. The frequency of this oscillator can be substantially greater than that of the reference oscillator and yet its close-in jitter (signal instability) will be controlled by the feedback loop to be a function of the low jitter of the stable reference oscillator. Because the jitter outside the bandwidth of the feedback loop remains that of the oscillator itself and because jitter generally reduces as oscillator frequency increases, the loop structure is often configured to facilitate higher oscillator frequencies.

The loop-reduced jitter will, however, be degraded by increases of the oscillator's gain (the ratio of oscillator frequency to control voltage). The oscillator gain itself is a function of operating conditions (e.g., temperature and voltage supply differences) and, in production, will also vary between upper and lower process corners that are determined by a number of process variables.

Accordingly, conventional phase-locked loop structures generally compromise signal stability because they increase the oscillator gain sufficiently to insure that, under all operating and process variations, the phase-locked loop can drive the oscillator's frequency to where it is phase locked to the reference signal. That is, this locking insurance is gained at the cost of degraded stability of the loop's output signal.

In order to maintain a desired loop bandwidth, the increased oscillator gain is generally offset by altering loop compensation elements. In particular, it is typically offset by increasing loop compensation capacitors which subtracts from circuit area which is always a limited resource in integrated-circuit realizations of phase-locked loops.

BRIEF SUMMARY OF THE INVENTION

The present invention is directed to phase-locked loop structures that facilitate enhanced stability of loop-generated signals.

These structures include an oscillator network, a feedback loop and a controller. The oscillator network generates a loop output signal with a frequency that varies in response to a control voltage and to a frequency-determining parameter, the feedback loop generates the control voltage in response to the loop output signal and a reference signal and the controller increments the frequency-determining parameter to maintain the control voltage within a predetermined control-voltage range.

These structures enhance signal stability by facilitating the use of low-gain oscillator structures and they simplify and shorten loop operations because the structures operate in a closed-loop condition at all times.

The novel features of the invention are set forth with particularity in the appended claims. The invention will be best understood from the following description when read in conjunction with the accompanying drawings.

DETAILED DESCRIPTION OF THE INVENTION

Figure 4:
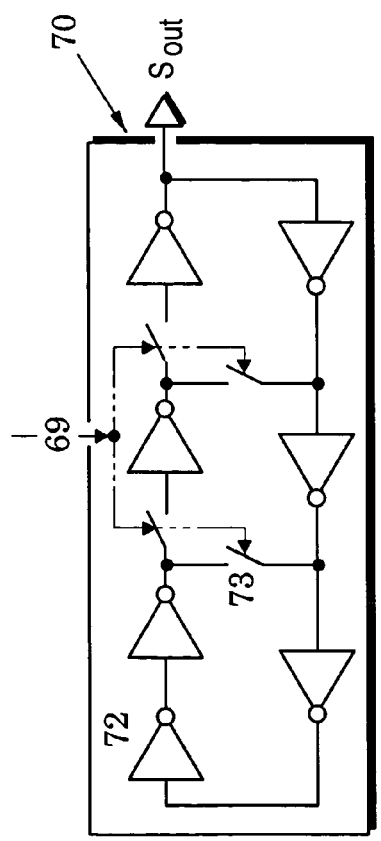
FIG. 4 is a diagram of a ring oscillator that can be used in the system of FIG. 3.

Phase-locked loop structures of the invention facilitate the use of low-gain oscillator circuits to thereby enhance signal stability. These structures operate in a closed-loop state (i.e., they do not require opening of the loop) which simplifies and shortens loop operations. Structural embodiments of FIGS. 1 and 4 and operational processes of FIGS. 2 and 4 are described below in detail.

Figure 1:
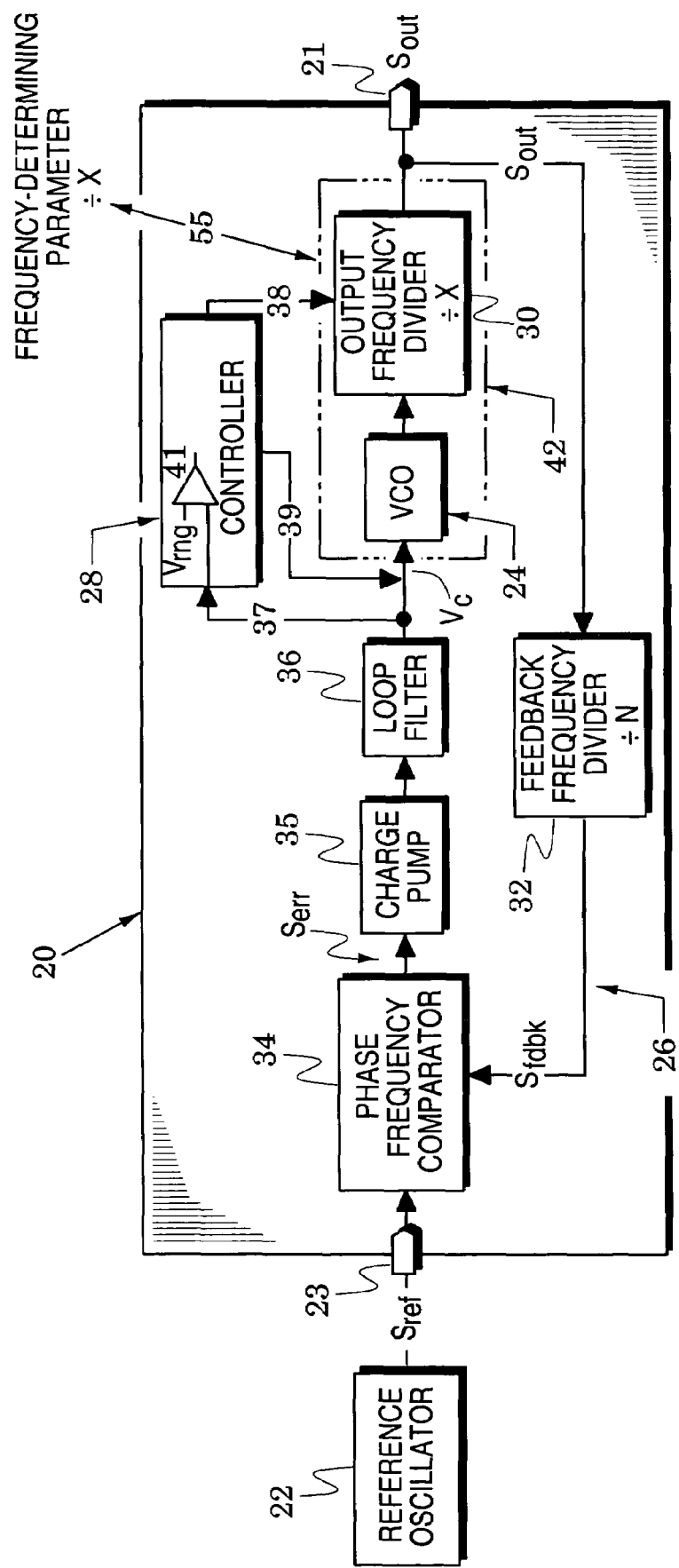
FIG. 1 is a block diagram of a phase-locked loop system embodiment of the present invention.
Figure 2:
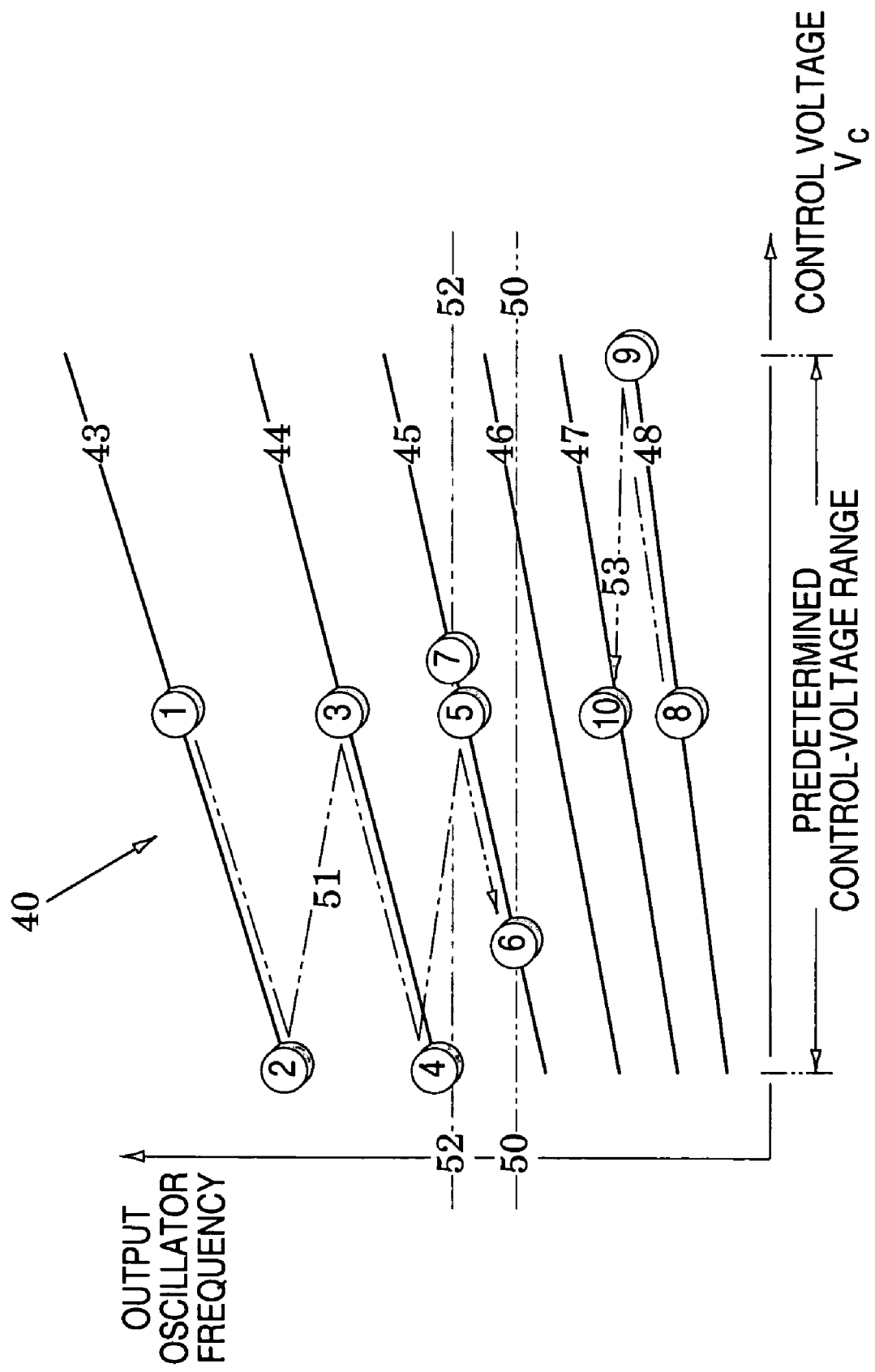
FIG. 2 is a graph of frequency in an output oscillator of the system of FIG. 1 which illustrates locking method embodiments of the invention.

In particular, FIG. 1 illustrates a phase-locked loop system 20 that provides a loop output signal $S_{out}$ at an output port 21 in response to the reference signal $S_{ref}$ of a reference oscillator 22 at an input port 23. The system 20 includes a voltage-controlled oscillator (VCO) 24, a feedback loop 26 and a controller 28. The VCO 24 generates an oscillator signal $S_{osc}$ whose frequency varies in response to a control voltage $V_c$ and the feedback loop 26 generates the control voltage $V_c$ in response to the phase difference between the reference signal $S_{ref}$ and a loop feedback signal $S_{fdbk}$. The feedback loop 26 includes an output frequency divider 30 and a loop frequency divider 32 and further includes a phase detector 34, a charge pump 35 and a loop filter 36.

In operation of the feedback loop 26, the output frequency divider 24 has a frequency divisor X and provides the loop output signal $S_{out}$ with an output frequency $F_{out}$ at the output port 21 in response to the oscillator frequency $F_{osc}$ of the oscillator signal of the VCO 24 (i.e., $F_{out}=(1/X)F_{osc}$). The loop frequency divider 32 has a frequency divisor N and generates the loop feedback signal $S_{fdbk}$ with a feedback frequency $F_{fdbk}$ in response to the output frequency $F_{out}$ of the loop output signal $S_{out}$ (i.e., $F_{fdbk}=(1/N)F_{out}$).

The phase detector 34 then generates an error signal $S_{err}$ in response to the phase difference between the reference signal $S_{ref}$ and the loop feedback signal $S_{fdbk}$. Finally, the charge pump 35 provides drive currents in response to the error signal $S_{err}$ and the loop filter 36 generates the control voltage $V_c$ in response to the drive currents.

The reference oscillator 22 can be chosen to select a particular reference signal $S_{ref}$. For example, the reference signal $S_{ref}$ may be selected to provide a desired spacing between the channels of the phase-locked loop system 20 when it is used as a synthesizer that generates a range of loop output signals $S_{out}$. Each channel is then generated with a corresponding selection of the divisor N of the loop frequency divider 32.

In further operation of the feedback loop 26, the divisor N can be initially selected to obtain a desired output frequency $F_{out}$. The controller 28 will then monitor the control voltage $V_c$ via monitor path 37 and a comparator 41 that compares the control voltage to a predetermined control-voltage range $V_{rng}$. In response to the comparator 41, the controller increments the divisor X of the output frequency divider (via divisor command path 38) to maintain the control voltage $V_c$ within the predetermined control-voltage range.

This operation can be described with reference to the graph 40 of FIG. 2 which illustrates a plurality of exemplary tuning curves. These tuning curves plot the output oscillator frequency of an output oscillator 42 which is shown in FIG. 1 to be formed by a combination of the VCO 24 and the output frequency divider 30. In particular, the plot 43 shows output oscillator frequency as a function of the control voltage $V_c$ over a predetermined control-voltage range.

An initial tuning curve 43 plots the output oscillator frequency for an initial selection of the divisor X of the output frequency divider 30. The additional tuning curves 44-48 are plots of the output oscillator frequency as the divisor X is successively incremented (in this embodiment, increased) from its initial selection. As shown in FIG. 2, portions of each adjacent pair of the tuning curves overlap in the frequency domain so that the curves provide continuous coverage over a large segment of the output oscillator frequency (i.e., all portions of this segment can be generated with this set of frequency curves.

In FIG. 2, the tuning curves have a positive slope, are linear and the space between adjacent curves decreases with decrease in the output oscillator frequency. It is noted that these characteristics are exemplary, are chosen for descriptive purposes and other VCO/divider embodiments will exhibit different characteristics. The slope, for example, is a function of VCO design and may be negative in other VCO embodiments. Linearity is also a function of VCO design and tuning slopes generally include some degree of nonlinearity. In addition, FIG. 2 does not necessarily show each tuning curve that would be exhibited as the divisor X is increased from its value for tuning curve 43. Some values of the divisor X, for example, may generate tuning curves spaced between those shown. These intermediate curves are not shown because those of FIG. 2 already provide continuous coverage over the desired frequency segment.

FIG. 2 illustrates an exemplary method of the invention in which the divisor N has previously been selected such that $NF_{ref}$ is at the broken line 50. When the phase-locked loop system (20 in FIG. 1) is locked, the output oscillator frequency will therefore be positioned at the broken line 50.

In FIG. 2, it has been assumed that the divisor X has been initially selected to place the output oscillator frequency on the tuning curve 43 and further assumed that the controller (28 in FIG. 1) initially applies (via voltage insertion path 39 in FIG. 1) a mid-range control voltage (i.e., a control voltage in the approximate middle of the predetermined control-voltage range). This control voltage positions the present output oscillator frequency at the #1 circle of FIG. 2 (insertion of the control voltage may be facilitated by inserting a small isolation resistor between the monitor path 37 and the voltage insertion path 39).

The feedback loop (26 in FIG. 1) is then allowed to drive the output oscillator frequency towards the frequency $NF_{ref}$ where the output signal $S_{out}$ would be locked to the reference signal $S_{ref}$. The loop drives the control voltage to the #2 circle which is at the limit of the predetermined control-voltage range. The controller senses this (e.g., with aid of a comparator) and increments the divisor X to place the output oscillator frequency on the tuning curve 44.

Again, the controller initially applies a mid-range control voltage which, positions the present output oscillator frequency at the #3 circle of FIG. 2. The loop then drives the control voltage to the #4 circle which is at the limit of the predetermined control-voltage range. Again, the controller senses this, increments the divisor X to place the output oscillator frequency on the tuning curve 45 and applies a mid-range control voltage which positions the current output oscillator frequency at the #5 circle.

The feedback loop is now able to drive the output oscillator frequency to the #6 circle where the loop locks so that the output oscillator frequency equals the frequency $NF_{ref}$ of the broken line 50. In the exemplary process just described, the control voltage traveled along the control-voltage path 51 and, because of the transfer function of the phase comparator 34, the output signal $S_{out}$ is now phase-coherent with the reference signal $S_{ref}$.

Once a tuning curve has been selected that crosses the $NF_{ref}$ frequency, the feedback action of the loop will automatically drive the control voltage to lock the output oscillator 42 to the reference signal. As another operational example, assume that $NF_{ref}$ is at the broken line 52 of FIG. 2 rather than at the broken line 50. In this case, the feedback action of the loop would have automatically driven the output oscillator frequency from the #5 circle to the #7 circle where the output oscillator frequency equals the frequency $NF_{ref}$ of the broken line 52.

In the above processes, the controller (28 in FIG. 1) applied a mid-point of the control-voltage range as the VCO's control voltage subsequent to incrementing the divisor X. It is noted that this is exemplary and various other points of the control-voltage range could be applied in other embodiments.

In another exemplary method, the divisor X could have been initially selected to place the output oscillator frequency on the tuning curve 48 of FIG. 2 and the controller (28 in FIG. 1) would then have initially applied a mid-range control voltage that would have positioned the present output oscillator frequency at the #8 circle. The feedback loop (26 in FIG. 1) would then have driven the output oscillator frequency to the #9 circle which is at the limit of the predetermined control-voltage range.

The controller (28 in FIG. 1) would have sensed this, decreased the divisor X to place the output oscillator frequency on the tuning curve 47 and applied a mid-range control voltage to position the current output oscillator frequency at the #10 circle. This process would then have continued in similar manner until the feedback loop drove the output oscillator frequency to the #6 circle (alternatively, to the #7 circle) where the loop automatically locks.

The phase-locked loop system 20 of FIG. 1 facilitates the use of a VCO whose gain has been reduced to thereby reduce jitter noise. Because of operating conditions and process-induced variations, this low-gain VCO would typically fail to successfully lock to the reference signal $S_{ref}$. The system 20, however, monitors the VCO control voltage and varies a frequency-determining parameter to lock the low-gain VCO to the reference signal $S_{ref}$.

In FIG. 1, the parameter arrow 55 indicates that the frequency-determining parameter of the output oscillator 42 (combination of the VCO 24 and the output frequency divider 30) is the output frequency divider's divisor X which can be controlled by the controller 28. Other embodiments of the invention are provided with other frequency-determining parameters.

Figure 3:
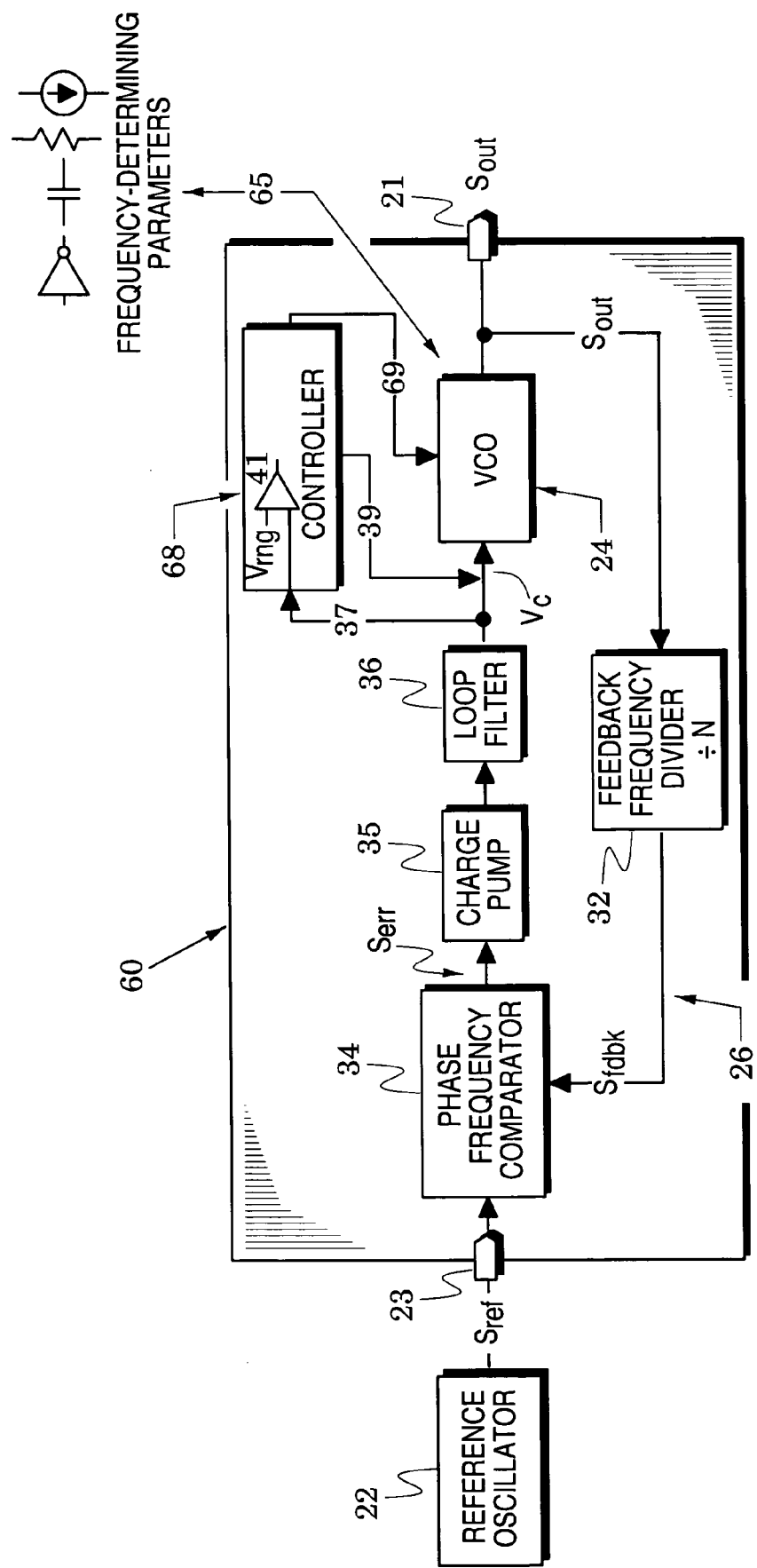
FIG. 3 is a block diagram of another phase-locked loop system embodiment of the present invention.

For example, FIG. 3 illustrates a phase-locked loop system 60 that is similar to the phase-locked loop system 20 of FIG. 1 with like elements indicated by like reference numbers. The system 60, however, replaces the output frequency divider (30 in FIG. 1) with different frequency-determining parameters. In particular, the parameter arrow 65 indicates that the system 60 employs VCO frequency-determining parameters such as inverters, capacitive loads, resistive loads and currents. A controller 68 controls at least one of these parameters via a parameter command path 69.

An exemplary embodiment of the VCO 24 of FIG. 3 is the VCO 70 of FIG. 4 which is a ring oscillator that is formed by inverters 72 that are coupled in a ring. Switches 73 are provided so that additional inverters can be coupled into the ring (or so that inverters can be removed from the ring) in response to the parameter command path 69.

Figure 6:
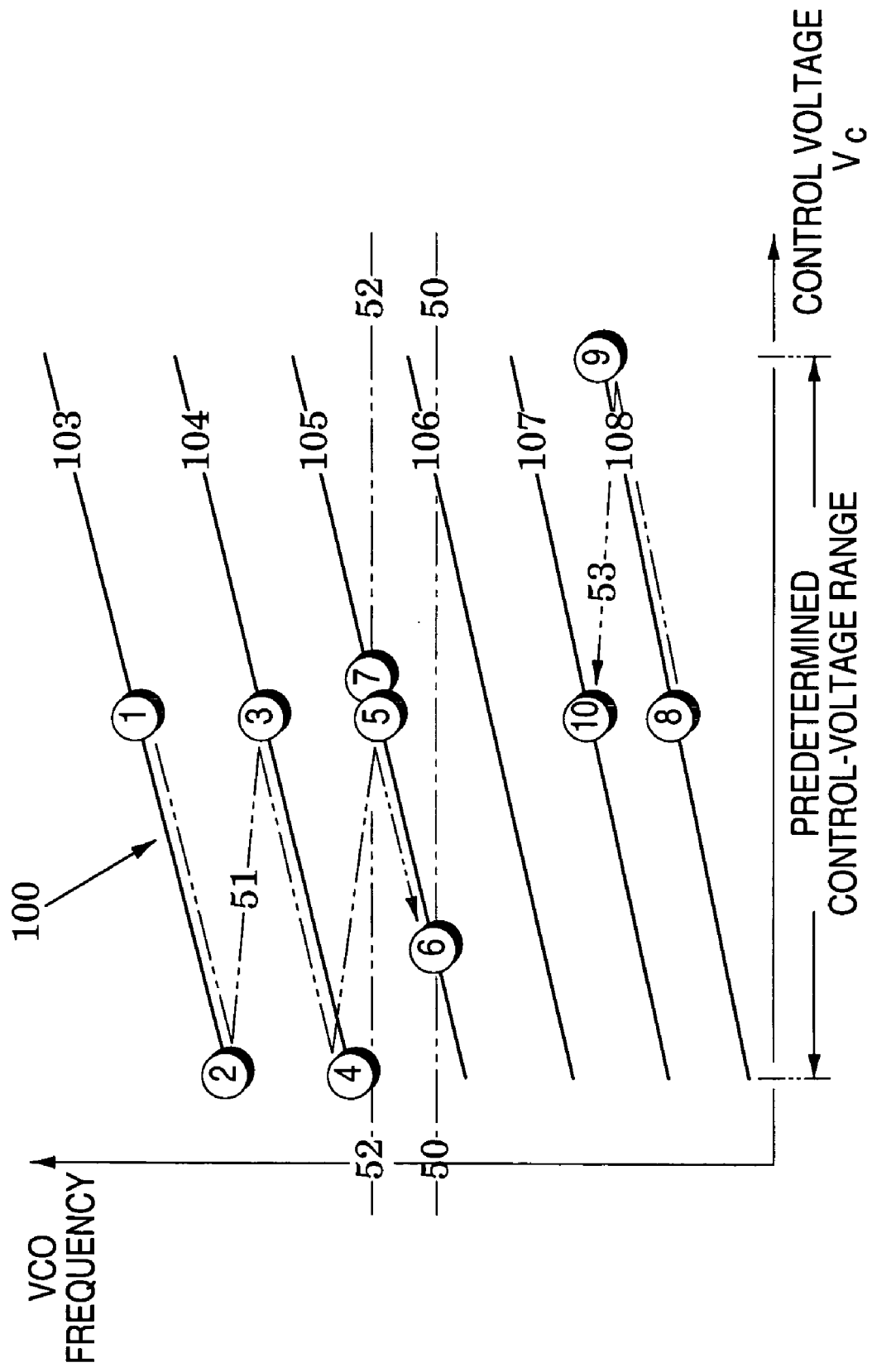
FIG. 6 is a graph of frequency in a voltage-controlled oscillator of the system of FIG. 3 which illustrates locking method embodiments of the invention.

The ring is preferably formed of an odd number of inverters so that one inverter is always in a time-delay process of converting its output to a state that corresponds to the state of its input. Because the ring oscillator's frequency is thus a function of the time delay through each inverter, the controller 68 can select among exemplary tuning curves 103-108 in FIG. 6 by selecting the current number of ring inverters with the switches 73. Adding inverters will generally cause the ring oscillator 70 to jump to the next lower tuning curve in the graph 100 of FIG. 6 which is similar to FIG. 2 but plots frequency of the VCO 24 of FIG. 3 rather than frequency of the output oscillator 42 of FIG. 1. FIG. 6 is similar to FIG. 2 (with like elements indicated by like reference numbers) but it replaces the tuning curves 43-48 of FIG. 2 with tuning curves 103-108.

Figure 5C:
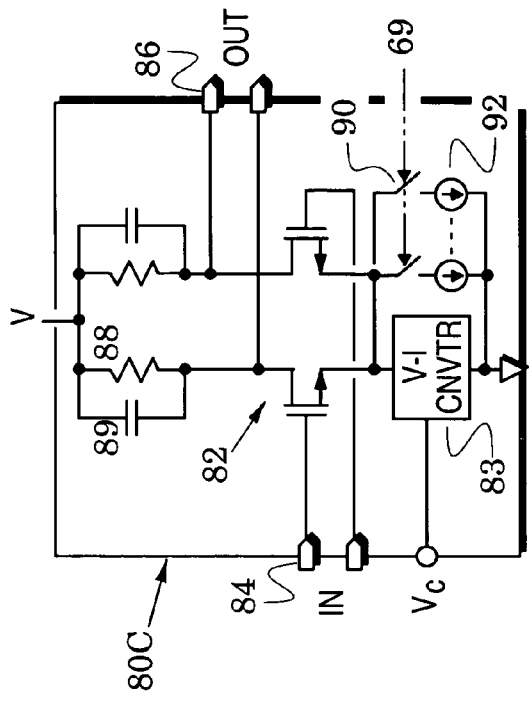
FIGS. 5A-5C are diagrams of inverters that can form the ring oscillator of FIG. 4.
Figure 5B:
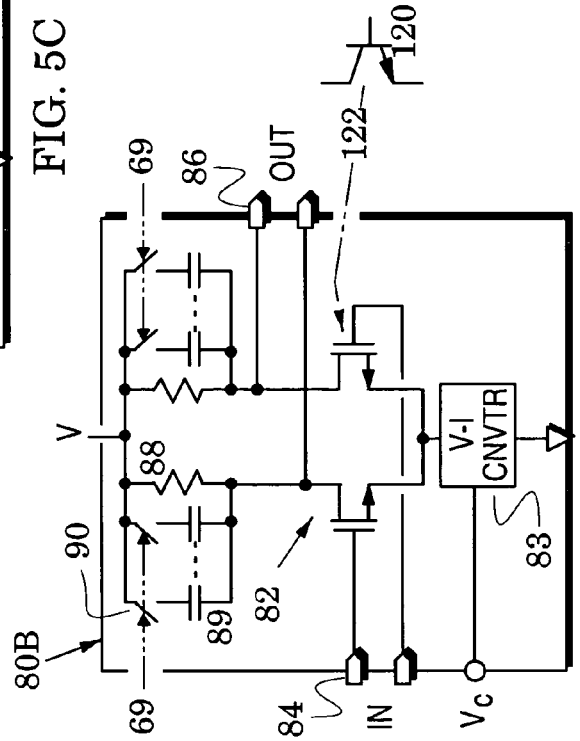
Figure 5A:
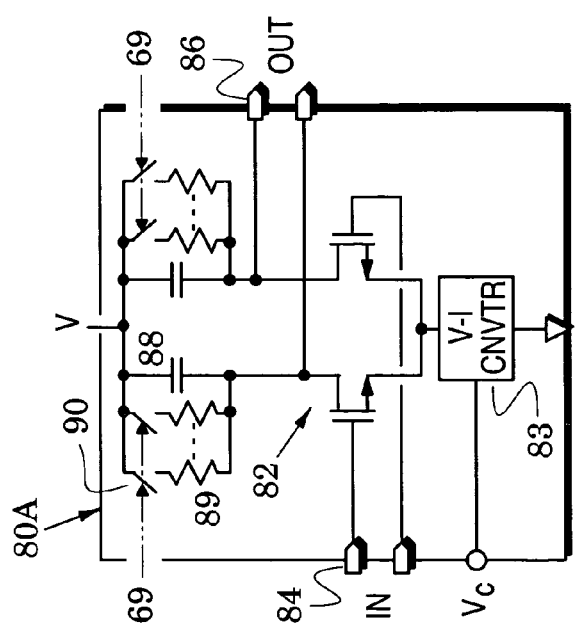

FIGS. 5A-5C illustrate embodiments 80A-80C of an inverter 72 of FIG. 4. As shown, the inverters 80A-80C comprise a differential pair 82 of transistors whose tail current is provided by a voltage-to-current converter 83 which responds to the control voltage $V_c$ (from the loop filter 36 in FIG. 3). Control terminals (i.e., gates) of the differential pair form the inverter input 84 and current terminals (i.e, drains) form the inverter output 86. Loads are coupled to each of the current terminals of the differential pair in the form of parallel capacitors 88 and resistors 89.

The differential pair 82 steers the tail current between its current terminals in response to signals at the inverter input 84 (from a preceding inverter). The inverter's output 86 drives a succeeding inverter and will switch states after a time delay that is determined by the time constant of the capacitive and resistive load. The inverter's time delay (i.e., time before its output state corresponds to the state of its input) is thus a function of the capacitance and resistance in the loads and of the magnitude of the tail current that the voltage-to-current converter 83 provides in response to the control voltage $V_c$.

In the inverter 80A of FIG. 5A, a plurality of resistors 89 can be switched into the inverter by switches 90 that respond to the parameter command path 69 from the controller (68 in FIG. 3). Accordingly, the controller can command the ring oscillator 70 of FIG. 4 to switch between the tuning curves 103-108 of the graph 100 of FIG. 6.

Removing resistors will generally cause the ring oscillator 70 to jump to the next higher tuning curve in FIG. 6. The frequency spacing between tuning curves will typically be more constant than that produced by increments of the divisor X of the output frequency divider (30 in FIG. 1) which generated unequal inter-curve spaces as seen in the graph 40 of FIG. 2.

In the inverter 80B of FIG. 5B, a plurality of capacitors 89 can be switched into the inverter by switches 90 that again respond to the parameter command path 69 from the controller. Accordingly, the controller can command the ring oscillator 70 of FIG. 4 to switch between the tuning curves 103-108 of the graph 100 of FIG. 6. Adding capacitors will generally cause the ring oscillator 70 to jump to the next lower tuning curve in FIG. 6.

In the inverter 80C of FIG. 5C, the resistive and capacitive loads are fixed but a plurality of current sources 92 can be switched in parallel with the voltage-to-current converter 83 by switches 90 that again respond to the parameter command path 69 from the controller. The tail current of the differential pair 82 is thus altered which alters the charging time of the capacitive loads and, therefore, the inverter's time delay. The controller 68 of FIG. 3 can thereby command the ring oscillator 70 of FIG. 4 to switch between the tuning curves 103-108 of the graph 100 of FIG. 6. Adding current sources will generally cause the ring oscillator 70 to jump to the next higher tuning curve in FIG. 6.

When the VCO 24 of FIG. 3 is formed by the ring oscillator 70 of FIG. 4 and it comprises any of the inverters 80A-80C of FIGS. 5A-5C, the VCO can therefore be commanded by the controller 68 of FIG. 3 to travel along exemplary control-voltage paths 51 and 53 as previously described with reference to FIG. 2.

Another VCO embodiment includes a resonant circuit that provides feedback to a transistor amplifier wherein the resonant circuit is formed with capacitance and inductance. With this VCO embodiment, the controller 68 increments (via divisor command path 69) the capacitance independently of the control voltage $V_c$ to thereby generate the tuning curves 83-88 of FIG. 4.

It is noted that the frequency of the output signal $S_{out}$ of the phase-locked loop system 60 of FIG. 3 can be subsequently altered by processing it with the output frequency divider 30 of FIG. 2. In this system embodiment, the system 60 is augmented by positioning the output frequency divider 30 in FIG. 2 to process the output signal $S_{out}$ after its generation by the system 60.

The frequency dividers of the invention can be realized with various conventional divider structures (e.g., dual-modulus prescalars).

Although the inverter transistors of FIGS. 5A-5C have been shown as complementary metal-oxide-semiconductor (MOS) transistors, other embodiments of the invention may be formed by substituting various other transistor structures. This substitution is exemplified in FIG. 5B where a bipolar junction transistor 120 is substituted for a transistor of the differential pair 82 as indicated by substitution arrow 122.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

We claim:

1. A phase-locked loop system that provides a loop output signal in response to a reference signal, comprising:
    an oscillator network that generates said loop output signal with a frequency that varies in response to a control voltage and to a frequency-determining parameter;

a feedback loop that generates said control voltage in response to the phase difference between said reference signal and a loop feedback signal wherein said feedback loop includes a loop frequency divider that has a divisor N and generates said loop feedback signal in response to said loop output signal; and a controller that increments said frequency-determining parameter to maintain said control voltage within a predetermined control-voltage range.

2. The system of claim 1, wherein said controller is configured to monitor said control voltage and increment said frequency-determining parameter each time said control voltage reaches a limit of said control-voltage range.

3. The system of claim 1, wherein said oscillator network includes:

an oscillator that generates an oscillator signal; and an output frequency divider that has a frequency divisor X and that provides said loop output signal in response to said oscillator signal;

and wherein said frequency divisor X is responsive to said controller so that said frequency-determining parameter is said frequency divisor X.

4. The system of claim 3, wherein said controller is configured to monitor said control voltage and increment said frequency divisor X each time said control voltage reaches a limit of said control-voltage range.

5. The system of claim 1, wherein said controller includes a comparator that compares said control voltage to said control-voltage range.

6. The system of claim 1, wherein said feedback loop includes:

a phase detector that generates an error signal in response to the phase difference between said reference signal and said loop feedback signal;

a charge pump that provides drive currents in response to said error signal; and a loop filter that generates said control voltage in response to said drive currents.

7. A phase-locked loop system that provides a loop output signal in response to a reference signal, comprising:

an oscillator that generates said loop output signal with a frequency that varies in response to a control voltage and to a frequency-determining parameter;

a feedback loop that generates said control voltage in response to the phase difference between said reference signal and a loop feedback signal wherein said feedback loop includes a loop frequency divider that has a divisor N and generates said loop feedback signal in response to said loop output signal; and a controller that increments said frequency-determining parameter to maintain said control voltage within a predetermined control-voltage range.

8. The system of claim 7, wherein said controller is configured to monitor said control voltage and increment said frequency-determining parameter each time said control voltage reaches a limit of said control-voltage range.

9. The system of claim 7, wherein said oscillator includes:

a plurality of inverters; and a plurality of switches that each couple a different number of said inverters in a ring in response to said controller; said frequency-determining parameter thereby formed by said inverters.

10. The system of claim 9, wherein said controller is configured to monitor said control voltage and command at least one of said switches each time said control voltage reaches a limit of said control-voltage range.

11. The system of claim 7, wherein said oscillator includes a ring of inverters that each have a plurality of resistive loads which can be selected by said controller, said frequency-determining parameter thereby formed by said resistive loads.

12. The system of claim 11, wherein said controller is configured to monitor said control voltage and select at least one of said resistive loads each time said control voltage reaches a limit of said control-voltage range.

13. The system of claim 7, wherein said oscillator includes a ring of inverters that each have a plurality of capacitive loads which can be selected by said controller, said frequency-determining parameter thereby formed by said capacitive loads.

14. The system of claim 13, wherein said controller is configured to monitor said control voltage and select at least one of said capacitive loads each time said control voltage reaches a limit of said control-voltage range.

15. The system of claim 7, wherein said oscillator includes a ring of inverters that each have a plurality of current sources which can be selected by said controller, said frequency-determining parameter thereby formed by said current sources.

16. The system of claim 15, wherein said controller is configured to monitor said control voltage and select at least one of said current sources each time said control voltage reaches a limit of said control-voltage range.

17. The system of claim 16, wherein said controller includes a comparator that compares said control voltage to said control-voltage range.

18. The system of claim 7, wherein said oscillator includes a ring of inverters that each includes:

a voltage-to-current converter that provides a tail current in response to said control voltage;

a pair of loads; and a differential pair of transistors that steer said tail current between said loads in response to a signal from another of said inverters.

19. The system of claim 18, wherein said loads include parallel resistive and capacitive loads.

20. The system of claim 7, wherein said feedback loop includes:

a phase detector that generates an error signal in response to the phase difference between said reference signal and said loop feedback signal;

a charge pump that provides drive currents in response to said error signal; and a loop filter that generates said control voltage in response to said drive currents.

21. An inverter system configured to lock to a reference signal, comprising:

inverters that are coupled together to form a ring and are each configured to steer an inverter current between inverter loads to provide an inverter output signal to an adjoining one of said inverters wherein the amplitude of said inverter current is a function of a control voltage and said loads have time constants that are functions of a command signal;

a feedback loop that generates said control voltage in response to the phase difference between said reference signal and an inverter output signal of any selected one of said inverters; and a controller that alters said command signal and, hence, said time constants when said control voltage exits a predetermined control-voltage range.

22. The system of claim 21, wherein each of said inverters includes:

a voltage-to-current converter that provides said inverter current and alters the amplitude of said inverter current in response to said control voltage; and a differential pair of transistors that steers said inverter current between said inverter loads.

23. The system of claim 22, wherein each of said inverters includes:

resistors;

capacitors; and switches that, in response to said command signal, couple together selected ones of said resistors and capacitors to form said inverter loads with selected ones of said time constants.

24. The system of claim 21, wherein said controller includes a comparator coupled to sense when said control voltage exits said predetermined control-voltage range.

25. The system of claim 21, wherein said feedback loop includes:

a phase detector that generates an error signal in response to a phase difference between said reference signal and said inverter output signal;

a charge pump that provides drive currents in response to said error signal; and a loop filter that generates said control voltage in response to said drive currents.

26. The system of claim 25, wherein said feedback loop further includes a frequency divider inserted to couple said inverter output signal to said phase detector.

27. An inverter system configured to lock to a reference signal, comprising:

inverters that are coupled together to form a ring and are each configured to steer an inverter current between inverter loads to provide an inverter output signal to an adjoining one of said inverters wherein the amplitude of said inverter current is a function of a control voltage and a command signal;

a feedback loop that generates said control voltage in response to the phase difference between said reference signal and an inverter output signal of any selected one of said inverters; and a controller that alters said command signal when said control voltage exits a predetermined control-voltage range.

28. The system of claim 27, wherein each of said inverters includes: capacitors coupled to form said inverter loads;

a voltage-to-current converter that provides said inverter current and alters the amplitude of said inverter current in response to said control voltage; and a differential pair of transistors that steers said inverter current between said inverter loads.

29. The system of claim 28, wherein each of said inverters includes: current sources; and switches that, in response to said command signal, couple selected ones of said current sources in parallel with said converter to alter said inverter current and, hence, the charging times of said capacitors.

30. The system of claim 27, wherein said controller includes a comparator coupled to sense when said control voltage exits said predetermined control-voltage range.

31. The system of claim 27, wherein said feedback loop includes:

a phase detector that generates an error signal in response to a phase difference between said reference signal and said inverter output signal;

a charge pump that provides drive currents in response to said error signal; and a loop filter that generates said control voltage in response to said drive currents.

32. The system of claim 31, wherein said feedback loop further includes a frequency divider inserted to couple said inverter output signal to said phase detector.

33. An inverter system configured to lock to a reference signal, comprising:

ring switches;

inverters that are arranged with said ring switches to form a ring and are each configured to steer an inverter current between inverter loads to provide an inverter output signal to an adjoining one of said inverters wherein the amplitude of said inverter current is a function of a control voltage;

a feedback loop that generates said control voltage in response to the phase difference between said reference signal and an inverter output signal of any selected one of said inverters; and a controller that commands said ring switches to thereby alter the number of said inverters in said ring when said control voltage exits a predetermined control-voltage range.

34. The system of claim 33, wherein each of said inverters includes:

a voltage-to-current converter that provides said inverter current and alters the amplitude of said inverter current in response to said control voltage; and a differential pair of transistors that steers said inverter current between said inverter loads.

35. The system of claim 33, wherein said controller includes a comparator coupled to sense when said control voltage exits said predetermined control-voltage range.

36. The system of claim 33, wherein said feedback loop further includes a frequency divider inserted to couple said inverter output signal to said phase detector.

* * * * *